United States Patent
Wittenbreder, Jr.

(10) Patent No.: US 7,439,717 B1
(45) Date of Patent: Oct. 21, 2008

(54) SECONDARY SIDE POST REGULATORS

(75) Inventor: Ernest Henry Wittenbreder, Jr., Flagstaff, AZ (US)

(73) Assignee: Ernest H. Wittenbreder, Jr., Flagstaff, AZ (US)

( * ) Notice: Subject to any disclaimer, the term of this patent is extended or adjusted under 35 U.S.C. 154(b) by 79 days.

(21) Appl. No.: 11/684,743

(22) Filed: Mar. 12, 2007

Related U.S. Application Data

(62) Division of application No. 10/944,588, filed on Sep. 18, 2004, now abandoned.

(51) Int. Cl.
 *G05F 1/563* (2006.01)
(52) U.S. Cl. ........... 323/266; 323/271; 363/21.04
(58) Field of Classification Search .......... 323/266, 323/271, 282; 363/21.04
 See application file for complete search history.

(56) References Cited

U.S. PATENT DOCUMENTS

| | | | | |
|---|---|---|---|---|
| 4,447,866 A | * | 5/1984 | Reeves | 363/21.08 |
| 4,669,036 A | * | 5/1987 | Cowett, Jr. | 363/21.09 |
| 5,113,333 A | * | 5/1992 | Ou | 363/25 |
| 5,317,496 A | * | 5/1994 | Seiersen | 363/24 |
| 5,396,412 A | * | 3/1995 | Barlage | 363/89 |
| 5,534,768 A | * | 7/1996 | Chavannes et al. | 323/267 |
| 5,612,862 A | * | 3/1997 | Marusik et al. | 363/93 |
| 5,841,313 A | * | 11/1998 | Levin et al. | 327/393 |
| 5,894,214 A | * | 4/1999 | Jiang | 323/222 |
| 6,771,518 B2 | * | 8/2004 | Orr et al. | 363/16 |
| 7,218,081 B2 | * | 5/2007 | Jang et al. | 323/266 |
| 2006/0062026 A1 | * | 3/2006 | Wittenbreder, Jr. | 363/21.06 |

* cited by examiner

*Primary Examiner*—Jeffrey Sterrett

(57) ABSTRACT

A synchronously switched buck post regulator is revealed for multi-output forward converters. The synchronously switched buck post regulator accomplishes precise independent load regulation for each output and reduced magnetics volume by using a coupled inductor with a common core for all outputs plus a second smaller inductor for each output except the highest voltage output.

1 Claim, 7 Drawing Sheets

US 7,439,717 B1

SECONDARY SIDE POST REGULATORS

CROSS-REFERENCE TO RELATED APPLICATION

This is a division of application Ser. No. 10/944,588, filed 2004 Sep. 18, now abandoned.

BACKGROUND OF THE INVENTION

1. Field of the Invention

The subject invention generally pertains to electronic power conversion circuits, and more specifically to high frequency, switched mode electronic power converters. Some of the subject matter of this application was first revealed in Disclosure Document Number 527396.

2. Description of Related Art

Many electronic circuits require power at more than one voltage, so power supply manufacturers offer power supplies with multiple regulated outputs. This was often an application for magnetic amplifiers, but magnetic amplifiers have become less popular as switching frequencies have risen and silicon semiconductor prices have fallen. One common way of providing additional regulated outputs in current use is illustrated in FIG. 1. Operational wave forms for the FIG. 1 circuit are illustrated in FIG. 2. In FIG. 1 a second regulated output is provided by a synchronously switched buck post regulator, which is a sort of semiconductor magnetic amplifier. In the FIG. 1 circuit an output choke $L_1$ is provided for the main output and a second output choke $L_2$ is provided for the second output. In general the first output voltage is fed back to control the primary switch and the second output is regulated with a local feedback loop which controls the delay in the turn on time of $M_{S2A}$ with respect to the turn on time of $M_{S1A}$. This is leading edge modulation which is similar to that used in a magnetic amplifier. In most of these power converters there is a maximum power level which is the sum of the powers of the two outputs, but either of the two outputs can be operated at or near the maximum power level. This requires two output chokes each of which must be sized for the converter's maximum power level. An alternate method is illustrated in FIG. 3. The FIG. 3 circuit uses a coupled output choke to obviate two separate magnetic circuit elements sized for maximum power. In the coupled inductor the single core must be sized for maximum power and the window area must be sized to accommodate two windings each of which must be capable of accommodating the maximum output power. This is an improvement which results in a smaller and cheaper output choke, compared to the FIG. 1 circuit. The disadvantage of the FIG. 3 circuit is that the second output is not independently regulated and two secondary windings are required on the main transformer. What is needed is a circuit that achieves the performance of the FIG. 1 circuit but with lower total output choke volume.

OBJECTS AND ADVANTAGES

An object of the subject invention is to reveal a technique for achieving multiple independently regulated output voltages with reduced total magnetics volume.

Further objects and advantages of my invention will become apparent from a consideration of the drawings and ensuing description.

These and other objects of the invention are provided by new circuit structures for achieving independently regulated outputs in a multi-output power supply with reduced magnetics volume. Also revealed is a simple capacitor coupled floating drive circuit that is tolerant of voltage variations at the terminals of the high side switch.

SUMMARY

The subject invention reveals a circuit that can achieve multiple independently regulated outputs in a forward converter with lower overall magnetic circuit volume and cost.

DESCRIPTION OF THE PREFERRED EMBODIMENTS

Figure 1:
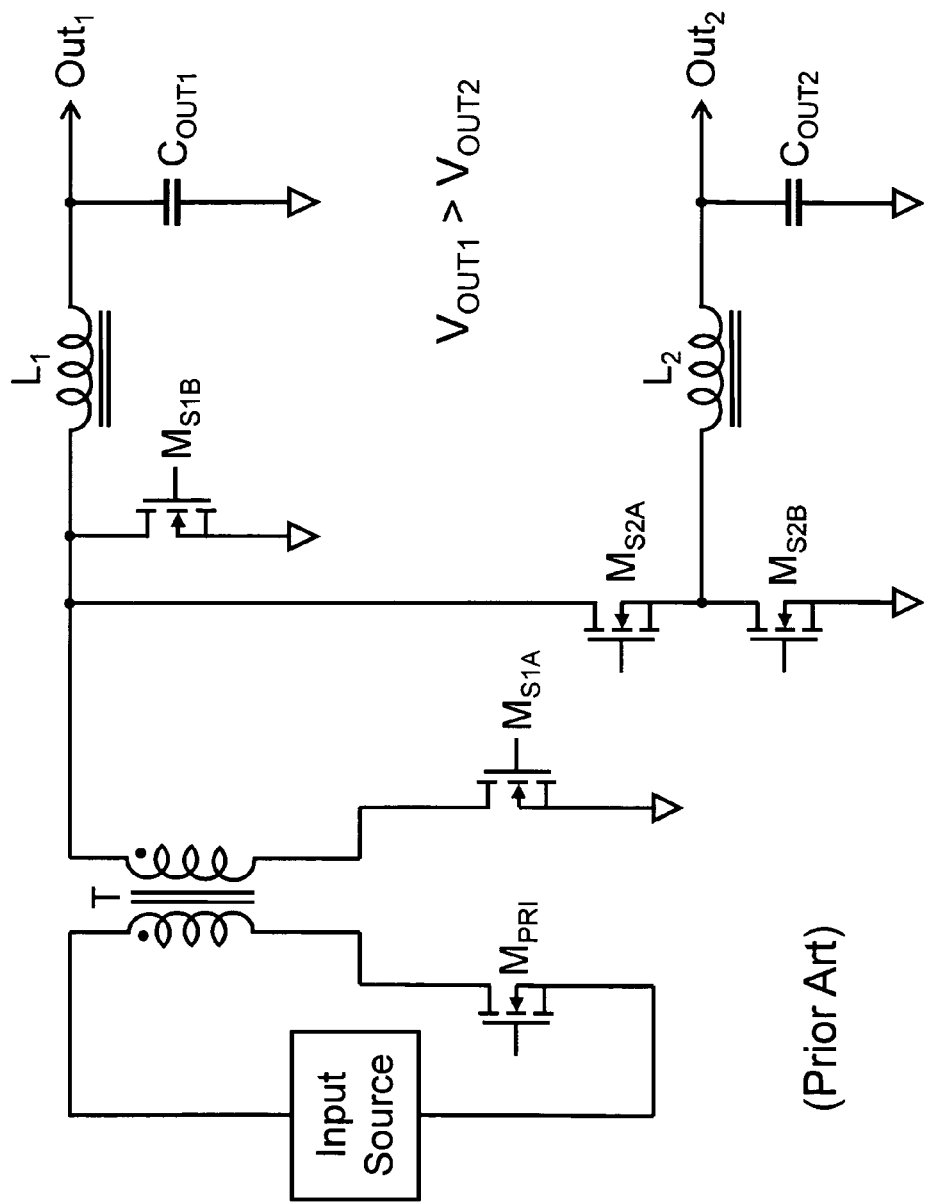
FIG. 1 illustrates a forward converter with two independently regulated outputs according to the prior art.
Figure 2:
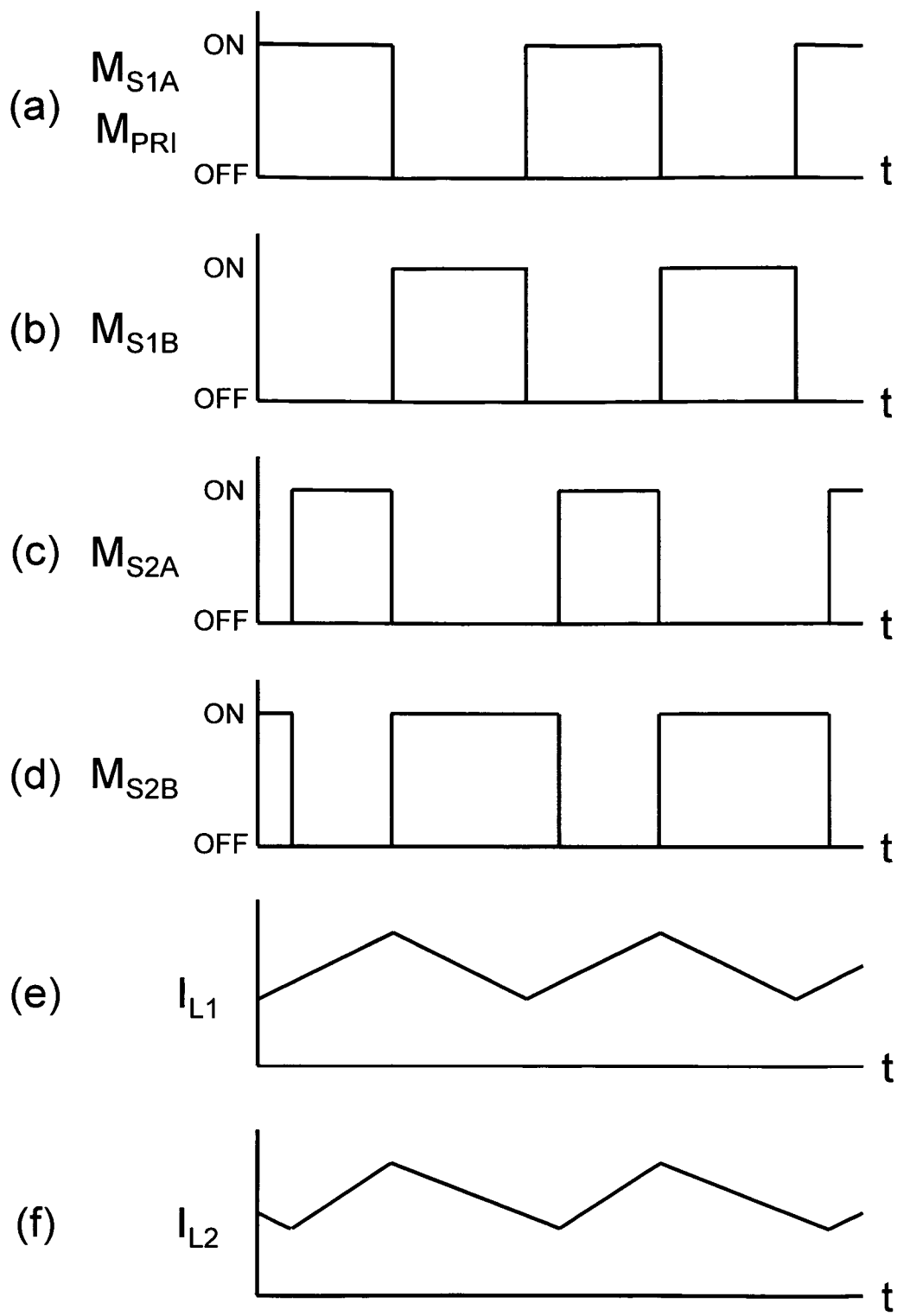
FIG. 2(a) illustrates the timing wave form for the $M_{PRI}$ and $M_{S1A}$ switches of FIG. 1.
FIG. 2(b) illustrates the timing wave form for the $M_{S1B}$ switch of FIG. 1.
FIG. 2(c) illustrates the timing wave form for the $M_{S2A}$ switch of FIG. 1.
FIG. 2(d) illustrates the timing wave form for the $M_{S2B}$ switch of FIG. 1.
FIG. 2(e) illustrates the current wave form for the $L_1$ inductor of FIG. 1.
FIG. 2(f) illustrates the current wave form for the $L_2$ inductor of FIG. 1.
Figure 3:
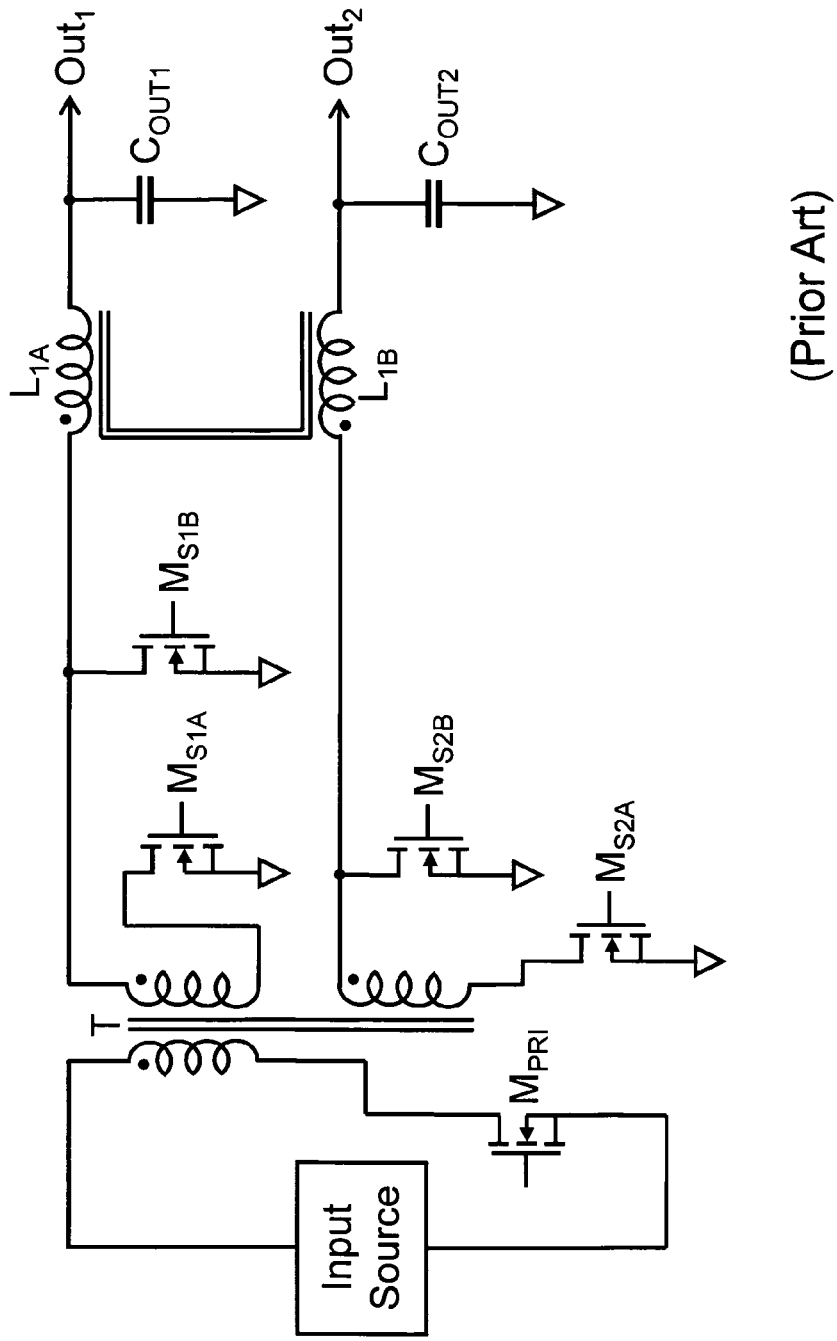
FIG. 3 illustrates a forward converter with two outputs utilizing a single coupled output choke according to the prior art.

FIG. 1 illustrates a single-ended forward converter with two outputs that can be independently regulated. The first output relies on modulation of the primary switch to achieve its regulation. The second output relies upon a second local control loop (not shown) to accomplish its regulation. The second output is a synchronously switched buck converter which is also referred to as a semiconductor magnetic amplifier since the switch control is similar to that of a magnetic amplifier. The main switch, $M_{S2A}$, of the second output's buck converter is turned off in synchronization with the first output in each switching cycle and turned on after the switch $M_{S1A}$ during each switching cycle. Wave forms of the switch timing and output choke currents are illustrated in FIGS. 2(a) through 2(f). In commercial multi-output power supplies the designer's goal is to provide two independently regulated outputs, each of which can handle the converter's full output power rating in order to accommodate the broadest range of customers. In the FIG. 1 circuit each of the two output chokes must be sized to accommodate the full output load. FIG. 3 illustrates another prior art example that has been used for multi-output power supplies. In the FIG. 3 circuit there is a single output choke that accommodates both outputs, but the two outputs cannot be independently regulated in the FIG. 3 circuit. Different voltage levels can be set by adjusting the turns ratios for the two outputs. The turns ratio for the secondary windings should match the turns ratio for the coupled inductor windings in order for the output currents to be non-pulsating. The FIG. 3 circuit has the advantage of smaller magnetics over the FIG. 2 circuit, since the two outputs share a common magnetic core, but the two outputs are not independently regulated. The common magnetic core of the two outputs of the FIG. 3 circuit need only be large enough to handle the full power of the power supply.

Figure 4:
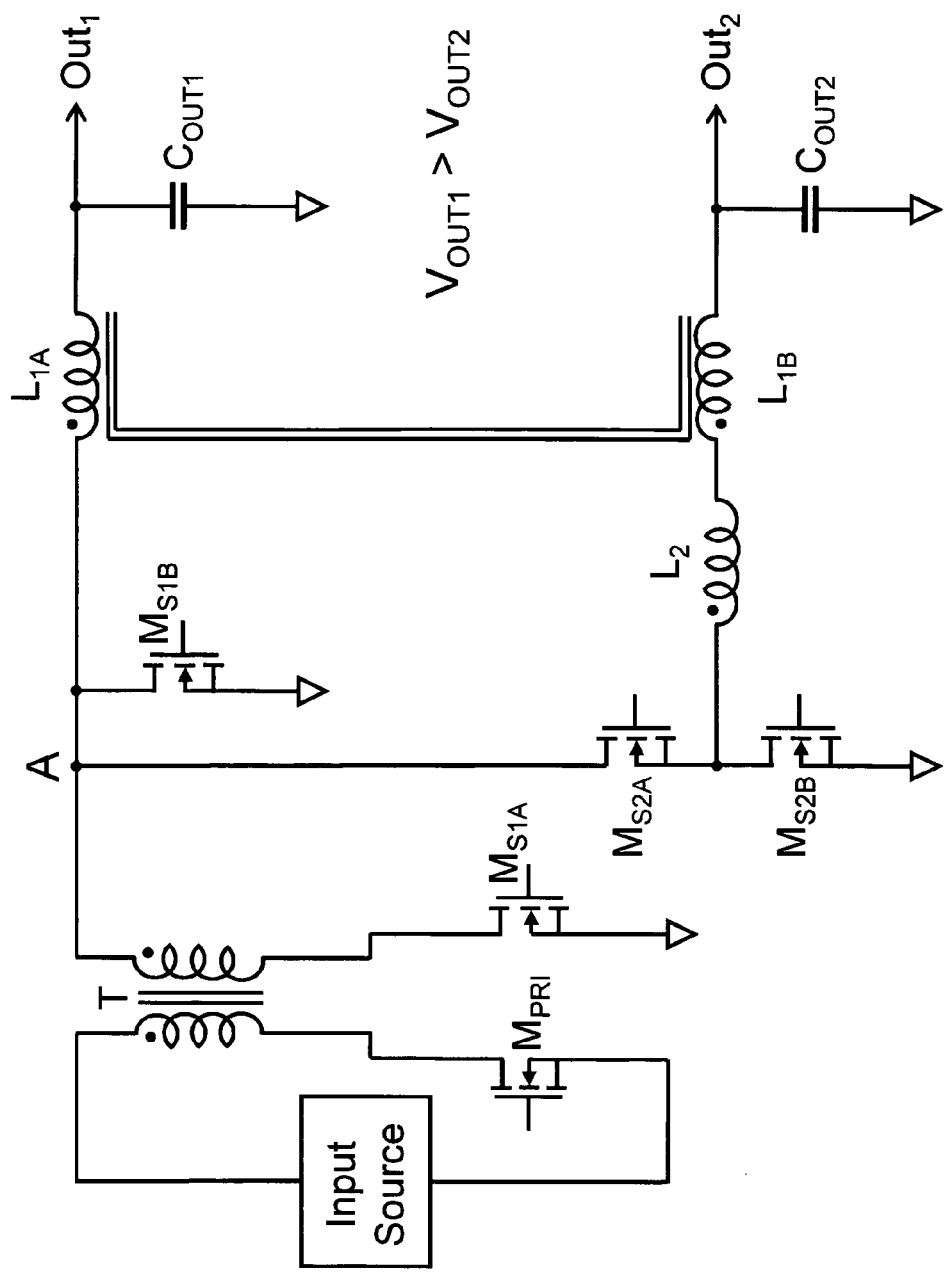
FIG. 4 illustrates a forward converter with two independently regulated outputs using a coupled output choke according to the subject invention.

FIG. 4 illustrates a two output power supply with independently regulated outputs that uses a common magnetic core for the two outputs, thereby saving the space of another large core sized to handle the full output power, plus a second much smaller core, $L_2$, with a much smaller inductance that adds the ability to independently regulate the second output in a synchronously switched buck converter. In the FIG. 4 circuit the first output is controlled by controlling the duty cycle of the primary switch $M_{PRI}$. The switch $M_{S1A}$ is operated in full synchronization with $M_{PRI}$ and the switch $M_{S1B}$ is operated in anti-synchronization to $M_{PRI}$. A wave form illustrating the switch timing for $M_{PRI}$ and $M_{S1A}$ is illustrated in FIG. 5(a). A wave form illustrating the timing for the $M_{S1B}$ switch is illustrated in FIG. 5(b). The output voltage for the first output is determined by the duty cycle of $M_{PRI}$ and the turns ratio of the transformer T. For the second output the switch $M_{S2A}$ is turned off in synchronization with $M_{PRI}$, but $M_{S2A}$ is turned on after $M_{PRI}$ so that there is a delay between the time $M_{PRI}$ is turned on and the time at which $M_{S2A}$ is turned on, as illustrated in FIG. 5(c). Switch $M_{S2B}$ turns on in synchronization with switch $M_{S1B}$ when $M_{PRI}$ is turned off, but $M_{S2B}$ turns off after $M_{S1B}$ is turned off due to the delay in the turn on of $M_{S2A}$. $M_{S2B}$ operates in anti-synchronization to $M_{S2A}$, as illustrated in FIG. 5(d). Because $M_{S2A}$ is delayed with respect to $M_{PRI}$ and $M_{S1A}$ the duty cycle for the second output will be less than the duty cycle for the first output and the voltage at the second output will be less than the voltage at the first output. The inductor $L_2$ forces the output current for the second output to be non-pulsating since an infinite voltage would be required to create a step change in current in $L_2$. The current in $L_{1A}$ is also non-pulsating, since there is no mechanism in the circuit to instantly interrupt current flow in either $L_{1A}$ or $L_{1B}$. Current in $L_{1A}$ is provided through $M_{S1A}$ and the transformer secondary winding when $M_{PRI}$ is on or through $M_{S1B}$ when $M_{PRI}$ is off, although $L_{1A}$ could still be pulsating despite this fact, but only if the current in $L_{1B}$ is interrupted. $L_2$ forces the current in $L_{1B}$ to be continuous. The currents in $L_{1A}$ and $L_{1B}$ will both be continuous, but they will not, in general, be simple triangular wave forms. A current wave form for $L_{1A}$ is illustrated in FIG. 5(e) and a corresponding wave form for $L_{1B}$ current is illustrated in FIG. 5(f). The current in $L_{1B}$ must be equal to the current in $L_2$, since the two windings are in series. The slope of the current in $L_2$ will depend on the value of $L_2$ and the voltage applied to $L_2$. During the course of one switching cycle there are three different values of applied voltage for $L_2$. When $M_{PRI}$ is off $M_{S1B}$ and $M_{S2B}$ are on and the voltage at the node A is zero. While $M_{PRI}$ is off the dotted terminal of $L_2$ is at ground and the undotted terminal of $L_2$ is at a voltage $V_1$, where $$V_1 = V_{OUT2} - \frac{N_2}{N_1} * V_{OUT1},$$

$V_{OUT2}$ is the output voltage of the second output, $V_{OUT1}$ is the output voltage of the first output, $N_2$ is the number of turns of $L_{1B}$, and $N_1$ is the number of turns of $L_{1A}$. Depending on the turns ratio, $$\frac{N_2}{N_1},$$

the current slope of $L_2$ during the time that $M_{PRI}$ is off can be positive, negative, or zero. In the example illustrated the current slope of $L_2$ is near zero during the off time of $M_{PRI}$, as illustrated in FIG. 5(f). When $M_{PRI}$ turns on, $M_{S1A}$ also turns on, and the voltage at the node A becomes positive, such that $$V_A = \frac{N_{SEC}}{N_{PRI}} * V_{INPUT},$$

where $V_{INPUT}$ is the voltage of the input source, $N_{PRI}$ is the number of primary turns of transformer T, and $N_{SEC}$ is the number of secondary turns of transformer T. While $M_{S1A}$ is on and $M_{S2B}$ remains on, the voltage at the undotted terminal of $L_2$ is $V_2$, where $$V_2 = V_{OUT2} + \frac{N_2}{N_1} * (V_A - V_{OUT1}),$$

so that the undotted terminal of $L_2$ is higher in voltage than the dotted terminal of $L_2$ and the current in $L_2$ must be decreasing. In the example illustrated the rate of decreasing current is relatively large for this example while $M_{PRI}$ is on and $M_{S2A}$ is off, as illustrated in FIG. 5(f). When $M_{S2B}$ turns off and $M_{S2A}$ turns on, while $M_{PRI}$ and $M_{S1A}$ remain on, the voltage at the dotted terminal of $L_2$ is $V_A$ and the voltage at the undotted terminal of $L_2$ is $V_2$ and the voltage applied to $L_2$ is $V_3$, where $V_3 = V_A - V_2$. During the on time of $M_{S2A}$, the current slope in $L_2$ can be positive, negative, or zero depending on the turns ratio, $$\frac{N_2}{N_1},$$

and the values of $V_A$, $V_{OUT1}$, and $V_{OUT2}$. In the example illustrated the current slope in $L_2$ is positive, as illustrated in FIG. 5(f). In a practical application the current slope of $L_2$ during the on time of $M_{S2A}$ will, in general, be positive. Since $L_2$ is connected in series with $L_{1B}$ the current in $L_{1B}$ will always be equal to the current in $L_2$. The current slope in $L_{1A}$ will depend on the voltage applied to $L_{1A}$ and on the current slope of $L_{1B}$ and $L_2$. The relationship between the voltage applied to $L_{1A}$ and its current slope is $$V_{L1A} = L_{1A} * \frac{dI_{L1A}}{dt} + M_{12} * \frac{dI_{L1B}}{dt} = L_{1A} * \frac{dI_{L1A}}{dt} + M_{12} * \frac{dI_{L2}}{dt}, \quad (1)$$

where $V_{L1A}$ is the $L_{1A}$ applied voltage, $I_{L1A}$ is the current in $L_{1A}$, $I_{L1B}$ is the $L_{1B}$ current, $M_{12}$ is the $L_{1A}L_{1B}$ mutual inductance, and $I_{L2}$ is the $L_2$ current. From equation (1) we can solve for the $L_{1A}$ current slope so that $$\frac{dI_{L1A}}{dt} = \frac{V_{L1A}}{L_{1A}} - \frac{M_{12}}{L_{1A}} * \frac{dI_{L2}}{dt}. \quad (2)$$

From equation (2) we see how the $L_{1A}$ current slope depends on both the voltage applied to the $L_{1A}$ winding and the current slope in the $L_{1B}$ winding. The turns ratio, $$\frac{N_2}{N_1},$$

should be set to provide a minimum average applied voltage for $L_2$ in order to minimize the current slopes and output ripple currents, which serves to minimize the size of $L_2$. The primary benefit of the subject invention is a reduction in total magnetics volume combined with independent regulation of both outputs. The reduction of magnetics volume is accomplished by using a common core for the $L_{1A}$ and $L_{1B}$ windings so that only one large core capable of handling the full output power is required. A second smaller inductor, $L_2$, is required to provide independent regulation for both outputs.

Figure 5:
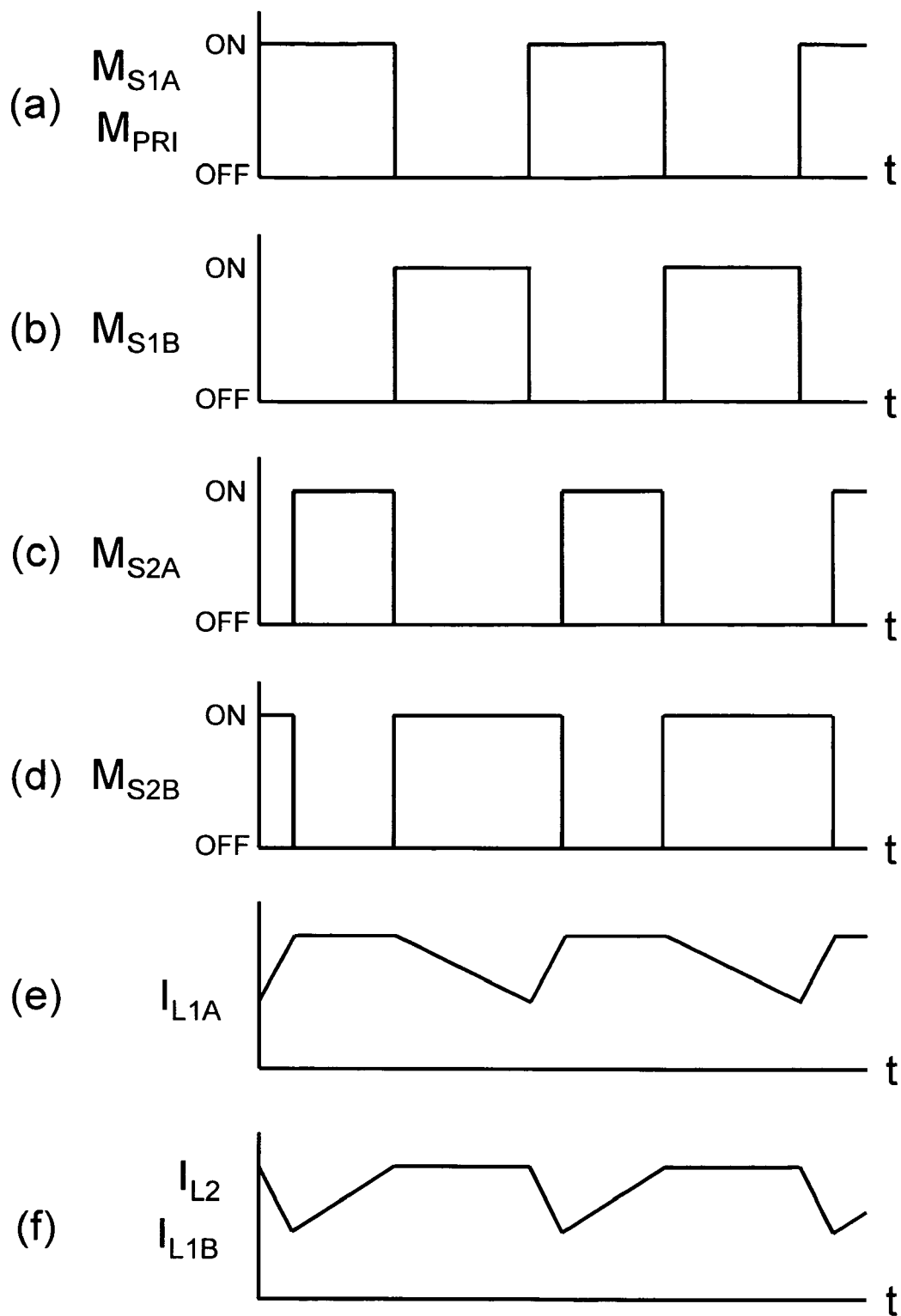
FIG. 5(a) illustrates the timing wave form for the $M_{PRI}$ and $M_{S1A}$ switches of FIG. 4 according to the subject invention.
FIG. 5(b) illustrates the timing wave form for the $M_{S1B}$ switch of FIG. 4 according to the subject invention.
FIG. 5(c) illustrates the timing wave form for the $M_{S2A}$ switch of FIG. 4 according to the subject invention.
FIG. 5(d) illustrates the timing wave form for the $M_{S2B}$ switch of FIG. 4 according to the subject invention.
FIG. 5(e) illustrates the current wave form for the $L_{1A}$ inductor of FIG. 4 according to the subject invention.
FIG. 5(f) illustrates the current wave form for the $L_2$ and $L_{1B}$ inductors of FIG. 4 according to the subject invention.
Figure 6:
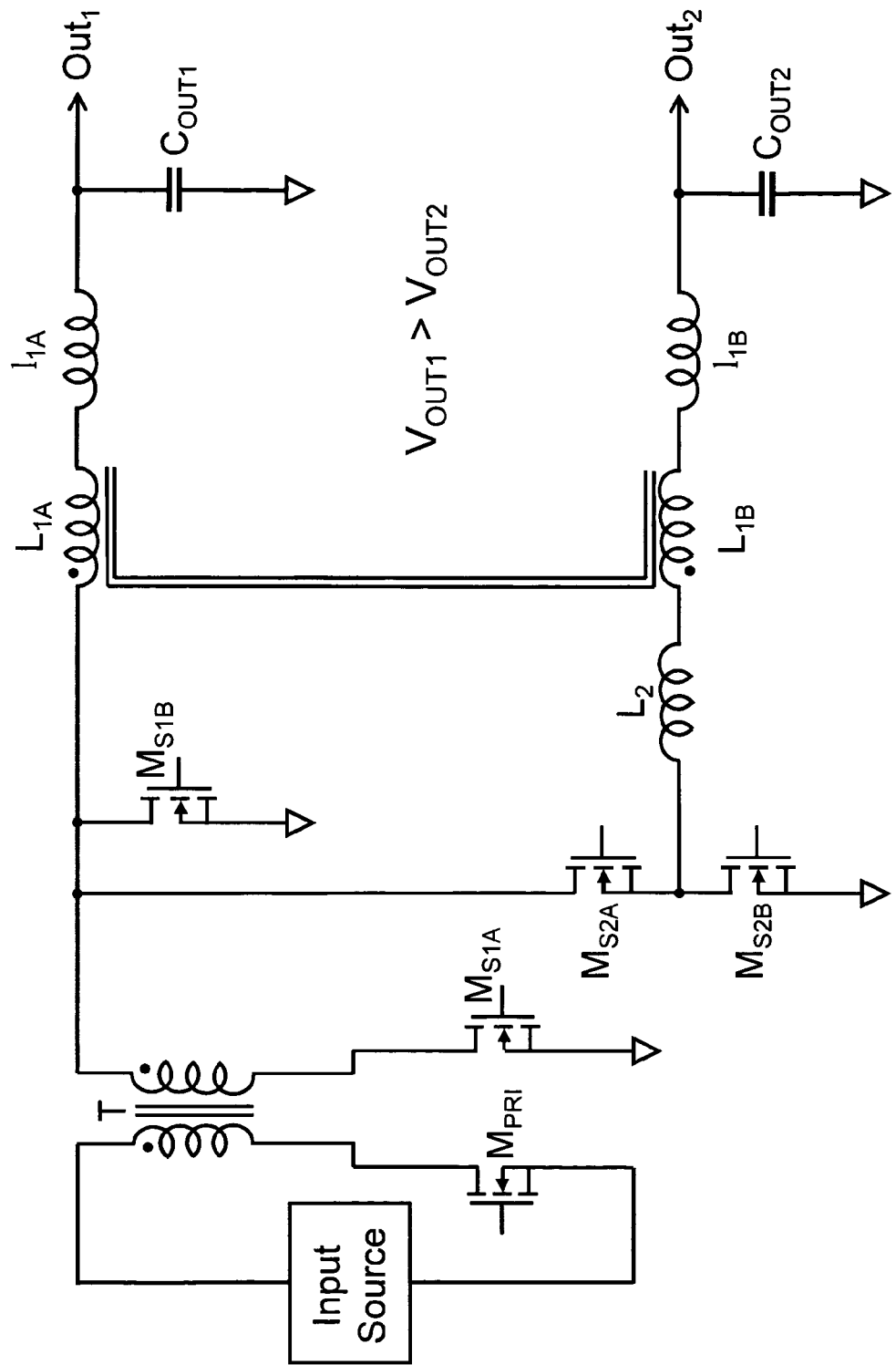
FIG. 6 illustrates a forward converter with two independently regulated outputs using a coupled output choke with low magnetic coupling according to the subject invention.

FIG. 5 illustrates the subject invention with series inductances $l_{1A}$ and $l_{1B}$, which represent the leakage inductances or uncoupled inductances in each winding of $L_1$. In general, it is preferable to loosely couple the windings in a coupled inductor forward converter application, thereby increasing the leakage inductances, since the main advantage of using the common core for both outputs is a size and cost reduction, not a performance improvement. The effect of the leakage inductance here is to improve the overall ripple performance. The relatively large leakage inductances, in comparison to a tightly coupled $L_1$, provide additional current smoothing without an additional magnetic circuit element.

Figure 7:
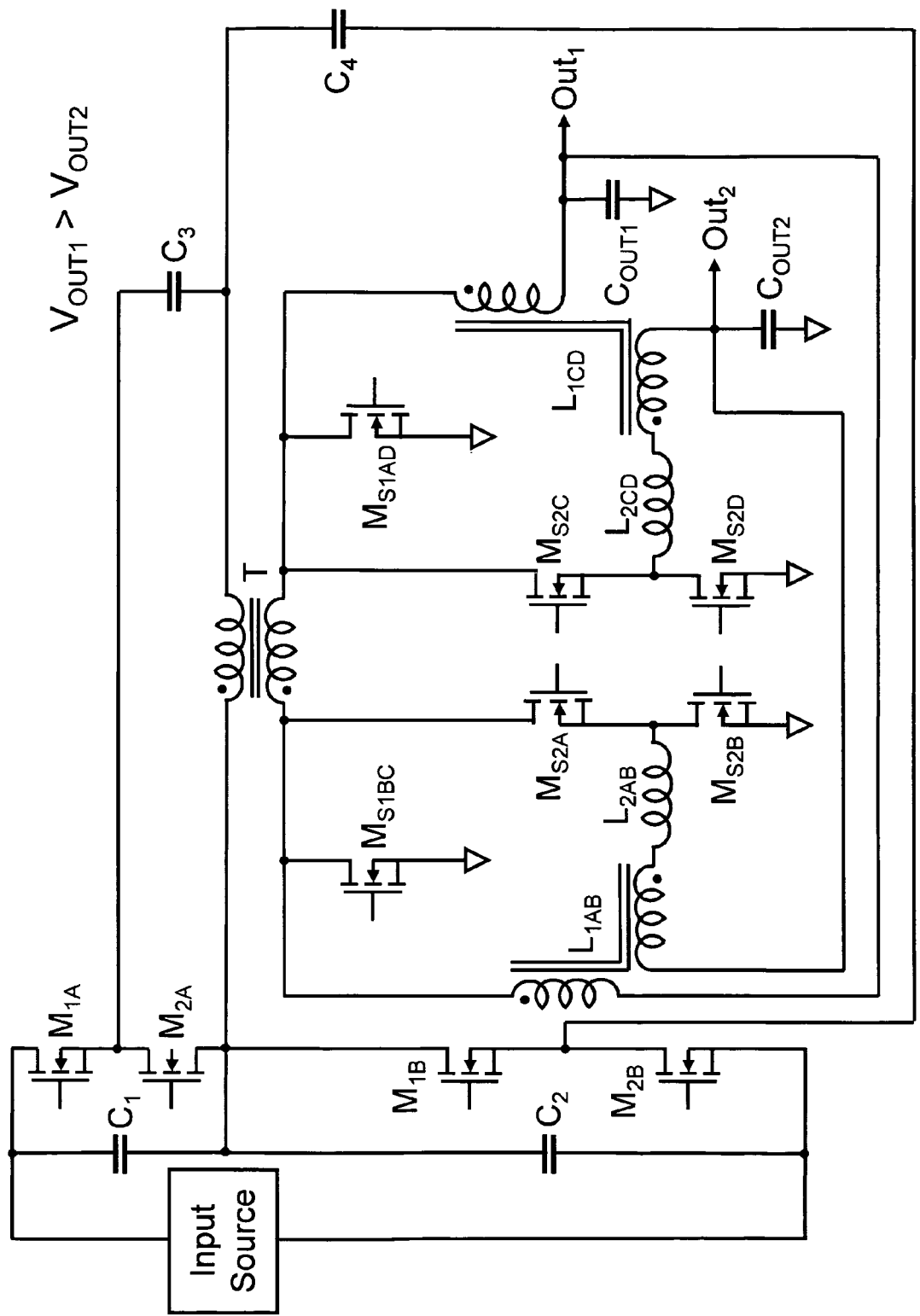
FIG. 7 illustrates a current doubler rectifier forward converter with a quarter bridge primary network and two independently regulated outputs using coupled output chokes according to the subject invention.

FIG. 7 illustrates a multi-output current doubler rectifier forward converter with a quarter bridge primary switching network and independently regulated outputs according to the subject invention. In the FIG. 7 circuit planar magnetics become more practical because of the reduction of primary winding voltage stress. In the current doubler configuration two chokes are required for each output. In the FIG. 7 circuit two independently regulated outputs are achieved using two large chokes and two small chokes.

CONCLUSION, RAMIFICATIONS, AND SCOPE OF INVENTION

Thus the reader will also see that a multi-output power supply using a secondary side synchronously switched post buck regulator can be improved by combining the output chokes onto a single core capable of handling the converter's full power and adding a small choke for the second output to provide fully independent regulation of the outputs.

While my above description contains many specificities, these should not be construed as limitations on the scope of the invention, but rather, as exemplifications or preferred embodiments thereof. Many other variations are possible. For example, power converters with more than two independently regulated outputs using a single large output coupled inductor plus much smaller chokes for the second and successive outputs are possible using the techniques revealed here.

Accordingly, the scope of the invention should be determined not by the embodiments illustrated, but by the appended claims and their legal equivalents.

I claim:

1. A secondary side buck post regulator for a second output of a multi-output forward converter comprising, a first coupled inductor having a first winding and a second winding with an undotted terminal of said first winding connected to a first output of said multi-output forward converter and with said second winding connected in series with said second output of said multi-output forward converter, a second inductor connected in series with said second winding of said first coupled inductor, first switch means having a drain terminal connected to a dotted terminal of said first winding of said first coupled inductor, second switch means, operable substantially in anti-synchronization to said first switch means, having a source terminal connected to an output terminal, which is common to said first output and to said second output of said multi-output forward converter and having a drain terminal connected to a source terminal of said first switch means and connected to a series winding network comprising said second inductor and said second winding of said first coupled inductor, whereby said secondary side buck post regulator provides a second precisely regulated output with reduced magnetics volume and cost.

* * * * *